United States Patent
Gambon et al.

(10) Patent No.: US 9,258,910 B2
(45) Date of Patent: *Feb. 9, 2016

(54) MULTI-DIRECTIONAL DISPLAY CONSOLE FOR AN ELECTRONIC EQUIPMENT CABINET

(71) Applicant: International Business Machines Corporation, Armonk, NY (US)

(72) Inventors: Kenneth T. Gambon, Erie, CO (US); Clayton A. Hollister, Papillion, NE (US); Bret W. Lehman, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/629,755

(22) Filed: Feb. 24, 2015

(65) Prior Publication Data
US 2015/0173213 A1 Jun. 18, 2015

Related U.S. Application Data

(63) Continuation of application No. 13/851,174, filed on Mar. 27, 2013, now Pat. No. 9,047,045.

(51) Int. Cl.
*G06F 1/16* (2006.01)
*H05K 5/00* (2006.01)
*G06F 1/18* (2006.01)
*H05K 7/14* (2006.01)
*H05K 5/02* (2006.01)

(52) U.S. Cl.
CPC ............ *H05K 5/0017* (2013.01); *G06F 1/1601* (2013.01); *G06F 1/183* (2013.01); *H05K 5/0226* (2013.01); *H05K 5/0247* (2013.01); *H05K 7/1494* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,718,740 | A * | 1/1988 | Cox | 312/223.2 |
| 6,142,590 | A * | 11/2000 | Harwell | 312/223.1 |
| 6,168,250 | B1 * | 1/2001 | Rogov | 312/294 |
| 6,185,092 | B1 * | 2/2001 | Landrum et al. | 361/679.11 |
| 6,201,690 | B1 * | 3/2001 | Moore et al. | 361/679.21 |
| 6,340,212 | B1 * | 1/2002 | Beiss et al. | 312/223.3 |
| 6,353,532 | B1 * | 3/2002 | Landrum et al. | 312/223.2 |
| 6,856,505 | B1 * | 2/2005 | Venegas et al. | 361/679.05 |
| 6,956,735 | B2 * | 10/2005 | Lee et al. | 361/679.06 |
| 7,019,963 | B2 * | 3/2006 | Lee et al. | 361/679.06 |
| 7,256,986 | B2 * | 8/2007 | Williams et al. | 361/679.55 |
| 7,724,511 | B2 | 5/2010 | Jacobs | |
| 7,894,194 | B2 * | 2/2011 | Shih et al. | 361/725 |
| 8,259,437 | B2 * | 9/2012 | Vesely | 361/679.01 |
| 8,570,723 | B2 * | 10/2013 | Myerchin | 361/679.05 |
| 8,848,376 | B2 * | 9/2014 | Lee | 361/725 |
| 9,047,045 | B2 | 6/2015 | Gambon et al. | |

(Continued)

*Primary Examiner* — Lisa Lea Edmonds
(74) *Attorney, Agent, or Firm* — John W. Hayes; William H. Hartwell

(57) ABSTRACT

An apparatus for a multi-directional display that includes a first surface situated in an electronic equipment cabinet, wherein the first surface is capable of extending out of at least two sides of the electronic equipment cabinet. A first electronic display is mechanically coupled to a first mount, such that the first electronic display is capable of rotating independently from the first mount. The first mount is coupled to the first surface, such that the first electronic display is viewable when the first surface is separately extended out of the at least two sides.

20 Claims, 4 Drawing Sheets

(56) References Cited

U.S. PATENT DOCUMENTS

| | | |
|---|---|---|
| 2002/0179549 A1* | 12/2002 | Felcman et al. ............... 211/26 |
| 2005/0117310 A1* | 6/2005 | Miyamoto et al. ............ 361/724 |
| 2005/0225217 A1* | 10/2005 | Nay et al. ................... 312/208.1 |
| 2006/0220505 A1* | 10/2006 | Nakamura et al. .......... 312/223.2 |
| 2006/0232917 A1* | 10/2006 | Wu et al. ...................... 361/681 |
| 2006/0289370 A1* | 12/2006 | Shih ............................... 211/26 |
| 2007/0058329 A1 | 3/2007 | Ledbetter et al. |
| 2007/0126321 A1* | 6/2007 | Waugh et al. ................. 312/245 |
| 2014/0293527 A1 | 10/2014 | Gambon et al. |

* cited by examiner

MULTI-DIRECTIONAL DISPLAY CONSOLE FOR AN ELECTRONIC EQUIPMENT CABINET

BACKGROUND

This disclosure relates generally to display consoles, and in particular, to housing a multi-directional display console.

In a typical data center, electronic equipment cabinets (i.e., racks) are common pieces of equipment to house servers, storage units, network devices, and other Information Technology (I/T) devices. Electronic equipment cabinets generally have designated units to store the common pieces of equipment. In order to manage all of the electronic equipment being housed in the cabinets, each cabinet often has a monitoring station also known as an administrative console. The administrative console is a work station typically consisting of a display, a keyboard, and mouse, which is used to monitor the operability of the electronic equipment housed in the cabinet. The administrative console can switch between the multiple pieces of electronic equipment in the cabinet housing and, as a result, one administration console can be used per cabinet to reduce costs.

Typical administrative consoles are designed to fit into a single rack unit (RU) in the cabinet housing allowing more space for the electronic equipment to be stored in the cabinet housing. The administrative console is accessed by a sliding mechanism in a "drawer" type of design, where it can slide out from the single rack unit in the electronic equipment cabinet. The administrative console is typically only accessed from the front of the electronic equipment cabinet where a technician (i.e., user) can view status indicators on equipment, power on and off various pieces of equipment, and insert portable media.

However, there are situations where the technician can be working from behind the electronic equipment cabinet adjusting cables, installing additional components, or doing other tasks relating to the electronic equipment. Accessing the administrator console to confirm outcome of these tasks can become an issue if there are multiple long rows of electronic equipment cabinets and the technician has to walk back and forth between the front and rear of the rack as changes are made to the electronic equipment from the rear of the electronic equipment cabinet.

SUMMARY

Embodiments in accordance with the present invention disclose an apparatus for a multi-directional display that includes a first surface situated in an electronic equipment cabinet, wherein the first surface is capable of extending out of at least two sides of the electronic equipment cabinet. A first electronic display is mechanically coupled to a first mount, such that the first electronic display is capable of rotating independently from the first mount, and the first mount is coupled to the first surface, such that the first electronic display is viewable when the first surface is separately extended out of the at least two sides.

BRIEF DESCRIPTION OF THE SEVERAL VIEWS OF THE DRAWINGS

The following detailed description, given by way of example and not intended to limit the disclosure solely thereto, will best be appreciated in conjunction with the accompanying drawings, in which.

DETAILED DESCRIPTION

Embodiments in accordance with the present invention are disclosed herein with reference to the accompanying drawings; however, it is to be understood that the disclosed embodiments are merely illustrative of potential embodiments in accordance with the invention and may take various forms. In addition, each of the examples given in connection with the various embodiments is also intended to be illustrative, and not restrictive. This description is intended to be interpreted merely as a representative basis for teaching one skilled in the art to variously employ the various aspects of the present disclosure. In the description, details of well-known features and techniques may be omitted to avoid unnecessarily obscuring the presented embodiments.

In general, an electronic equipment cabinet (e.g., server rack) contains an administrative console for managing all the electronic equipment within the given server rack. Administrative consoles are usually comprised of a display, a keyboard, and a mouse. The server rack is divided into multiple units, wherein a single unit is designated for a single piece of electronic equipment. Components housed in the units can be interchanged and configured according to preferences. Typically, the administrative console has a foldable display so it can be extended and retracted into a single unit in the server rack. The administrative console can extend out of and retract into the unit with the help of rollers that guide the administrative console. The administrative console typically extends in a single direction, towards the front of the server rack where a user (i.e., technician) can access information through the administrative console. However, it is common for the technician to work in the rear of the server rack where the administrative console cannot be readily accessed.

An embodiment in accordance with the present invention provides an administrative console capable of being accessed on multiple sides of a server rack.

Figure 1:
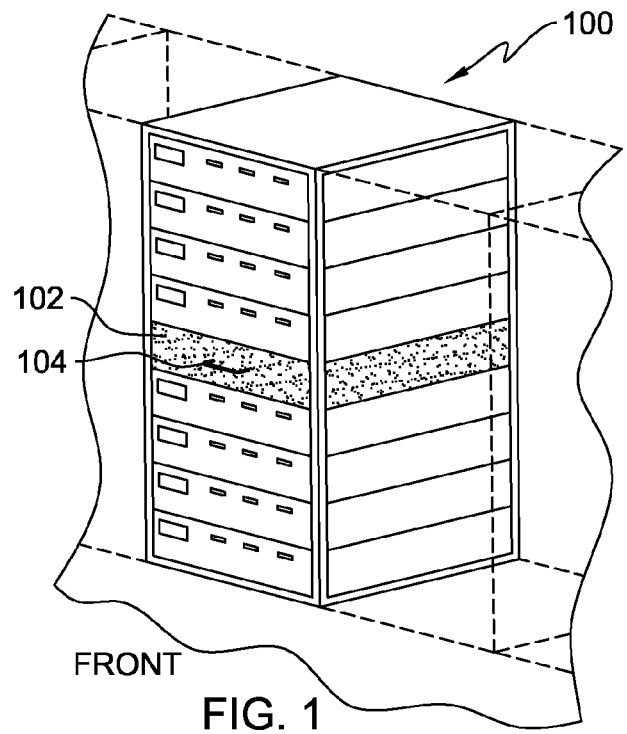
FIG. 1 depicts an isometric front view of a multi-directional display console situated in an electronic equipment cabinet in accordance with an embodiment of the present invention.

FIG. 1 depicts an isometric front view of a multi-directional display console situated in an electronic equipment cabinet in an embodiment in accordance with the present invention.

In this embodiment, enclosure 100 is a server rack. In other embodiments, enclosure 100 may be any enclosure designed to contain various electronic equipment or devices. Enclosure 100 is divided into units, where a single unit is designated for a single piece of electronic equipment. As depicted in FIG. 1, multi-directional display console 102 is situated in a single unit of enclosure 100. Multi-directional display console 102 is retracted into enclosure 100 as an example of how multi-directional display console 102 is positioned in enclosure 100 when not being used by a technician.

Multi-directional display console 102 has front handle 104 which the technician can use to slide multi-directional display console 102 to the front of enclosure 100. Multi-directional display console 102 can be positioned in any unit of enclosure 100. It shall be noted that there maybe multiple enclosures on either side of enclosure 100 limiting the accessibility to the rear of enclosure 100.

Figure 2:
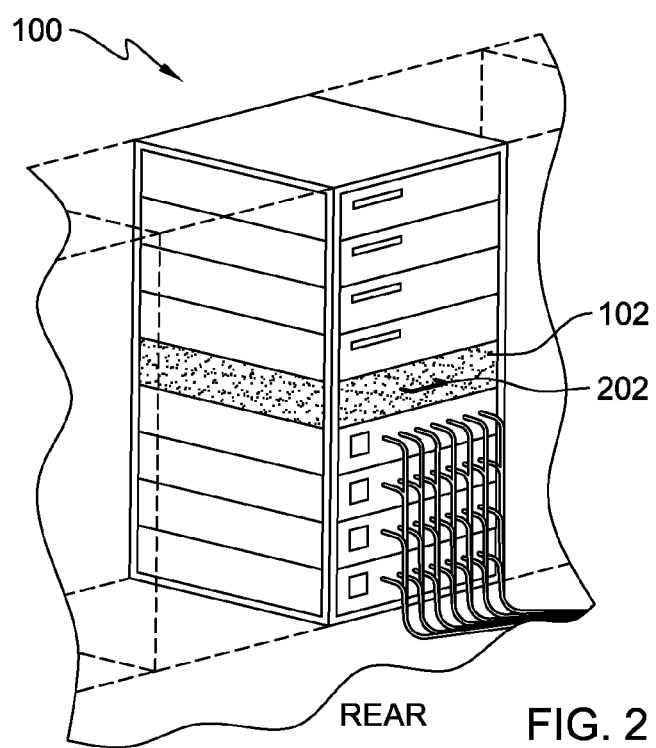
FIG. 2 depicts an isometric rear view of the multi-directional display console situated in the electronic equipment cabinet of FIG. 1.

FIG. 2 depicts an isometric rear view of the multi-directional display console situated in the electronic equipment cabinet of FIG. 1.

In this example, the rear of enclosure 100 has various cables extending from the units containing various pieces of electronic equipment. In the event the technician needs to make adjustments to the various pieces of electronic equipment from the rear of enclosure 100, the technician may need to monitor the changes being made. In order to monitor the changes being made, the technician has to have access to multi-directional display console 102. Multi-directional display console 102 has rear handle 202 which the technician can use to slide multi-directional display console 102 to the rear of enclosure 100. Sliding multi-directional display console 102 to the rear of enclosure 100 allows for the technician to monitor changes being performed at the rear of enclosure 100 without having to walk around the multiple enclosures to the front of enclosure 100 to use multi-directional console 102.

Figure 3:
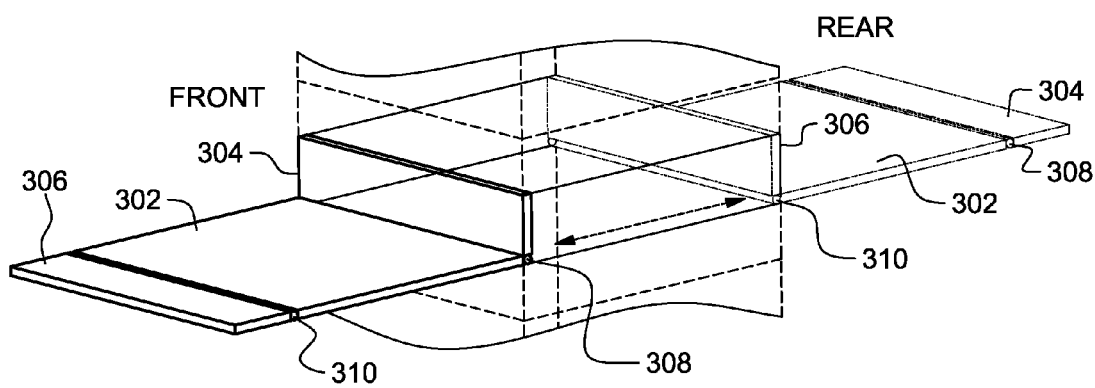
FIG. 3 depicts an enlarged isometric view of the multi-directional display console of FIG. 1 extended to the front of the electronic equipment cabinet.

FIG. 3 depicts an enlarged isometric view of the multi-directional display console of FIG. 1 extended to the front of the electronic equipment cabinet.

As depicted in FIG. 3, multi-directional display console 102 is comprised of base tray component 302, rear tray component 304, and front tray component 306. A single side of base tray component 302 is connected to a single side of rear tray component 304 through hinge 308. Hinge 308 allows for an angle variation between the connected base tray component 302 and rear tray component 304. Hinge 308 is lockable at any position according to a preference of the technician. For example, as depicted in FIG. 3, hinge 308 can be locked in a position where base tray component 302 and rear tray component 304 form a 90 degree angle.

Another single side of base tray component 302, opposite to the side of base tray component 302 connected to rear tray component 304, is connected to a single side of front tray component 306 through hinge 310. Similar to hinge 308, hinge 310 allows for an angle variation between the connected base tray component 302 and front tray component 306. Hinge 310 is also lockable at any position according to a preference of the technician. For example, as depicted in FIG. 3, hinge 310 can be locked in a position where base tray component 302 and front tray component 306 form a 180 degree angle. In another embodiment, hinge 308 and 310 can have an indicator displaying the position of hinge 308 and 310 with a corresponding adjustable height of multi-directional display console 102. Depending on a desired height position of multi-directional display console 102, the indicator can display the angle position of hinge 308 and 310 accordingly.

In the event multi-directional display console 102 is extended to the rear of enclosure 100, the position of hinge 308 and hinge 310 is reversed according to the depiction in FIG. 3. Hinge 308 is locked in a position where base tray component 302 and rear tray component 304 form a 180 degree angle. Hinge 310 is locked in a position where base tray component 302 and front tray component 306 form a 90 degree angle.

Figure 4:
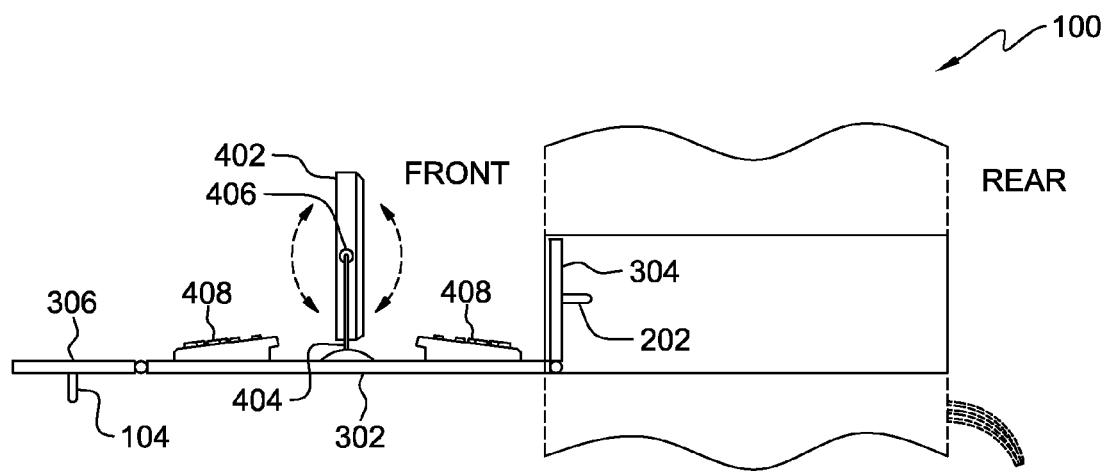
FIG. 4 depicts an enlarged view of a side view of the multi-directional display console of FIG. 1 extended to the front of the electronic equipment cabinet.

FIG. 4 depicts an enlarged view of a side perspective of the multi-directional display console of FIG. 1 extended to the front of the electronic equipment cabinet.

In this embodiment, display 402 is coupled to base tray component 302 through display mount 404. Display 402 may be a computer screen, a television screen, a tablet screen, or any electronic display capable of displaying monitoring information of the electronic equipment contained in enclosure 100. Display mount 404 can be secured to base tray component 302 in an immovable manner through the use of fasteners or bolts. Display 402 connects to display mount 404 through hinge 406. Hinge 406 allows for display 402 to rotate in any direction on the axis of hinge 406 and is lockable at any position according to the preference of the technician. In this example, display 402 faces away from enclosure 100. Input device 408 can also be secured to base tray component 302 and as depicted in FIG. 4, two input devices 408 can be used depending on the direction (i.e., front or rear) multi-directional display console 102 is extended out of enclosure 100. Input device 408 may be an electronic keyboard, an electronic mouse, an electronic stylus, or any electronic device capable of communicating with the content on display 402. In other embodiments, a single input device 408 can be used along with display 402. The single input device 408 can move along base tray component 302 to the side where multi-directional display console 102 is extracted from.

Figure 5:
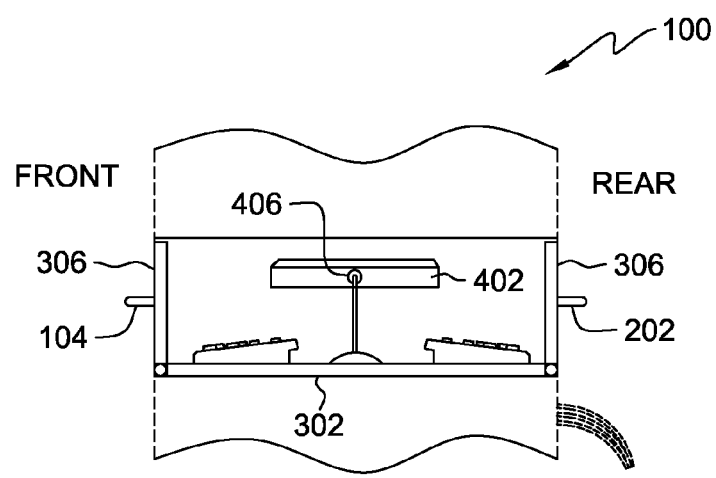
FIG. 5 depicts an enlarged view of a side view of the multi-directional display console of FIG. 1 retracted into the electronic equipment cabinet.

FIG. 5 depicts an enlarged view of a side perspective of the multi-directional display console of FIG. 1 retracted into the electronic equipment cabinet.

In this example, multi-directional display console 102 is retracted inside enclosure 100. Rear tray component 304 and front tray component 306 are secured in a 90 degree angle to base tray component 302 to ensure multi-directional display console 102 does not extrude from enclosure 100 when not in use by the technician. Display 402 is rotated in a manner and hinge 406 is secured in a position such that display 402 is parallel to base tray component 302. Display 402 secured in a position parallel to base tray component 302 optimizes the space of the single unit for multi-direction display console 102 to be stored in enclosure 100.

Figure 6:
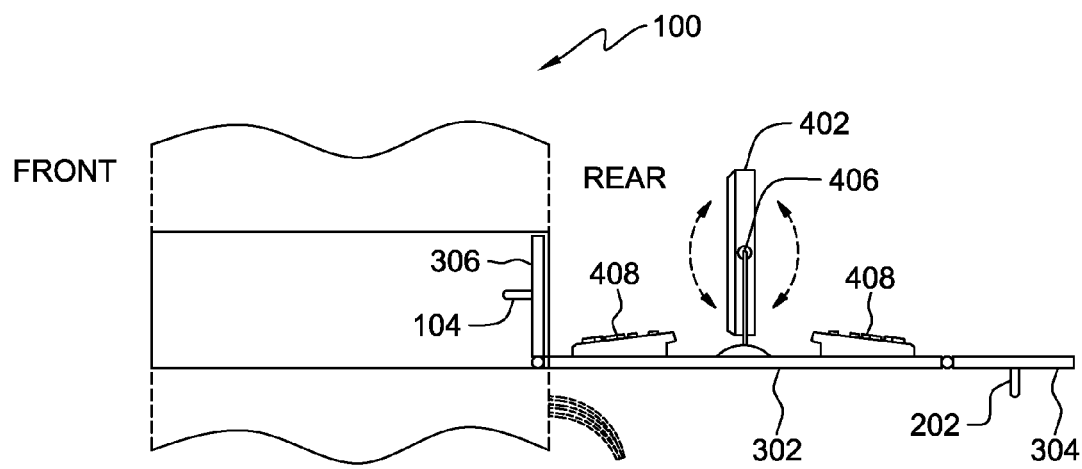
FIG. 6 depicts an enlarged view of a side view of the multi-directional display console of FIG. 1 extended to the back of the electronic equipment cabinet.

FIG. 6 depicts an enlarged view of a side perspective of the multi-directional display console of FIG. 1 extended to the back of the electronic equipment cabinet.

In this example, multi-directional display console 102 is extended to the rear of enclosure 100. As previously mentioned in the discussion of FIG. 3, hinge 308 is locked in a position where base tray component 302 and rear tray component 304 form a 180 degree angle. Hinge 310 is locked in a position where base tray component 302 and front tray component 306 form a 90 degree angle. Since hinge 406 is lockable at any position, hinge 406 maybe locked into a position such that display 402 faces away from enclosure 100.

In this embodiment, display 402 can receive an input from either one of the two input devices 408. Display 402 is automatically able to display content in the correct direction based on the orientation imposed on it by the technician. A sensor can be used to determine the orientation of display 402 and adjust the orientation of the displayed content accordingly. In another embodiment, the technician can manually select the orientation of display 402 through input device 408 so the displayed content is oriented accordingly.

Figure 7:
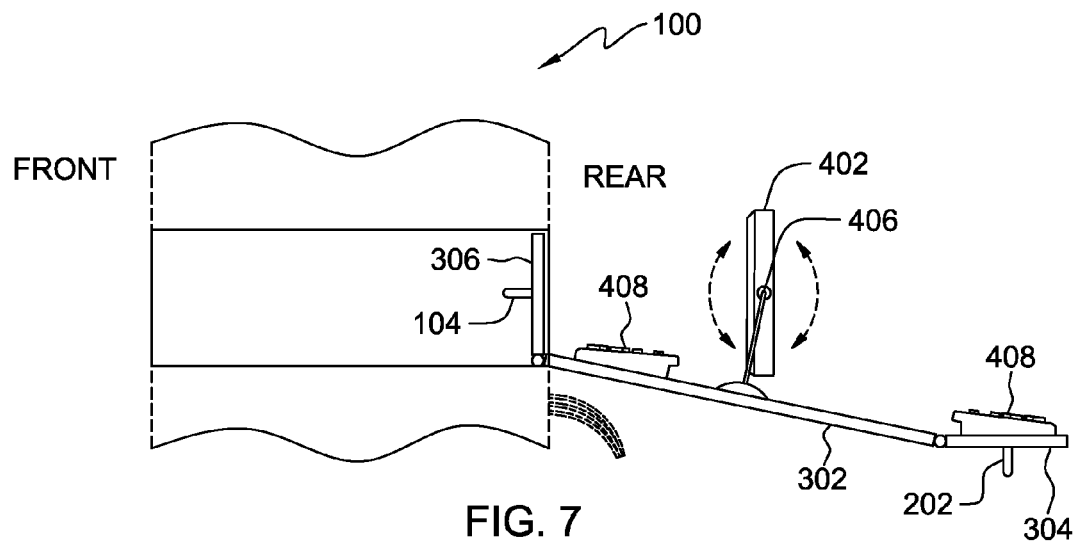
FIG. 7 depicts an enlarged view of a side view of the multi-directional display console of FIG. 1 utilizing a height adjustable feature.

FIG. 7 depicts an enlarged view of a side perspective of the multi-directional display console of FIG. 1 utilizing a height adjustable feature.

Multi-directional display console 102 can exploit the lockable properties of hinges 308, 310 and 406 for height adjustability. In this embodiment, multi-directional display console 102 is extended to the rear of enclosure 100 and adjusted to a lower height. By increasing the angle between front tray component 306 and base tray component 302 through lockable hinge 310, base tray component 302 is able to tilt lower when extended out of enclosure 100. By decreasing the angle between rear tray component 304 and base tray component 302 through lockable hinge 308, rear tray component 304 can be tilted level for use of input device 408 by the technician.

The terminology used herein is for the purpose of describing particular embodiments only and is not intended to be limiting to the invention. As used herein, the singular forms "a", "an" and "the" are intended to include the plural forms as well, unless the context clearly indicates otherwise.

Having described various embodiments of a multi-directional display console (which are intended to be illustrative and not limiting), it is noted that modifications and variations may be made by persons skilled in the art in light of the above teachings. It is therefore to be understood that changes may be made in the particular embodiments disclosed which are within the scope of the invention as outlined by the appended claims.

What is claimed is:

1. An apparatus for a multi-directional display, the apparatus comprising:
   a first surface situated in an electronic equipment cabinet, wherein the first surface is capable of extending out of at least two sides of the electronic equipment cabinet;
   a first electronic display mechanically coupled to a first mount, such that the first electronic display is capable of rotating independently from the first mount; and
   the first mount coupled to the first surface, such that the first electronic display is viewable when the first surface is separately extended out of the at least two sides.

2. The apparatus of claim 1, further comprising:
   the first electronic display mechanically coupled to a first hinge; and
   the first mount mechanically coupled to the first hinge, wherein the first hinge limits the rotation of the first electronic display.

3. The apparatus of claim 2, further comprising:
   a first side of the first surface mechanically coupled to a second hinge;
   a second surface mechanically coupled to the second hinge, such that the first surface is capable of rotating independently from the second surface;
   a second side of the first surface mechanically coupled to a third hinge; and
   a third surface mechanically coupled to the third hinge, such that the first surface is capable of rotating independently from the third surface.

4. The apparatus of claim 2, wherein the first hinge is lockable such that neither the first electronic display nor the first mount is capable of rotation.

5. The apparatus of claim 3, wherein the second hinge is lockable such that neither the first surface nor the second surface is capable of rotation.

6. The apparatus of claim 3, wherein the third hinge is lockable such that neither the first surface nor the second surface is capable of rotation.

7. The apparatus of claim 5, wherein the first surface is vertically adjustable based on the locked position of the second hinge when extended from the first side of the at least two sides.

8. The apparatus of claim 6, wherein the first surface is vertically adjustable based on the locked position of the third hinge when extended from the second side of the at least two sides.

9. The apparatus of claim 1, wherein a first electronic input device is used in conjunction with the first electronic display accessible from the first surface when extended out of the at least two sides.

10. The apparatus of claim 1, wherein the first electronic input device is one of: a keyboard, a mouse, or a stylus.

11. The apparatus of claim 2, wherein the first electronic display is capable of detecting orientation based on a current position as rotated along the first hinge.

12. The apparatus of claim 1, wherein the first electronic display is capable of receiving an input containing a desired orientation.

13. The apparatus of claim 1, further comprising:
    a second electronic display coupled to the first electronic display, such that a rear portion of the first electronic display is coupled to a rear portion of the second electronic display.

14. The apparatus of claim 13, wherein the first electronic display and the second electronic display are connected to a single electronic device.

15. The apparatus of claim 13, wherein the second electronic display is capable of detecting orientation based on a current position rotated along the first hinge.

16. The apparatus of claim 13, wherein the second electronic display is capable of receiving an input containing the orientation of the current position.

17. The apparatus of claim 13, wherein the first electronic input device is used in conjunction with the first and second electronic display depending on a side of the at least two sides the first surface extends from.

18. The apparatus of claim 13, wherein a second electronic input device is used in conjunction with the second electronic display.

19. The apparatus of claim 17, wherein the second electronic input device is one of: a keyboard, a mouse, or a stylus.

20. The apparatus of claim 7, wherein an indicator is used to specify a locked position of the second hinge for a specific vertical height of the first surface.

* * * * *